(12) United States Patent
Lee et al.

(10) Patent No.: US 8,957,436 B2
(45) Date of Patent: Feb. 17, 2015

(54) GETTER COMPOSITION AND ORGANIC LIGHT EMITTING DIODE DEVICE INCLUDING THE SAME

(75) Inventors: Byoung-Duk Lee, Giheung-Gu (KR); Yoon-Hyeung Cho, Giheung-Gu (KR); Jong-Hyuk Lee, Giheung-Gu (KR); Min-Ho Oh, Giheung-Gu (KR); So-Young Lee, Giheung-Gu (KR); Sun-Young Lee, Giheung-Gu (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 410 days.

(21) Appl. No.: 12/886,243

(22) Filed: Sep. 20, 2010

(65) Prior Publication Data

US 2011/0133213 A1 Jun. 9, 2011

(30) Foreign Application Priority Data

Dec. 8, 2009 (KR) .................. 10-2009-0121360

(51) Int. Cl.
H01L 33/00 (2010.01)
H01L 51/52 (2006.01)
H01J 7/18 (2006.01)

(52) U.S. Cl.
CPC ............. H01L 51/5237 (2013.01); H01J 7/183 (2013.01)
USPC .................................... 257/98; 257/E51.018

(58) Field of Classification Search
CPC ................................................ H01L 51/5259
USPC ................ 257/E51.018; 252/181.1
See application file for complete search history.

(56) References Cited

U.S. PATENT DOCUMENTS

| 5,591,379 | A * | 1/1997 | Shores .................... 252/194 |
| 6,226,890 | B1 | 5/2001 | Boroson et al. |
| 6,888,307 | B2 | 5/2005 | Silvernail et al. |
| 2003/0038590 | A1 | 2/2003 | Silvernail et al. |
| 2003/0143423 | A1 * | 7/2003 | McCormick et al. ......... 428/690 |
| 2005/0104032 | A1 * | 5/2005 | Cho et al. .................. 252/181.1 |
| 2006/0088663 | A1 | 4/2006 | Cho et al. |
| 2007/0013305 | A1 | 1/2007 | Wang et al. |
| 2008/0272333 | A1 * | 11/2008 | Blanco-Garcia et al. .. 252/181.6 |
| 2009/0065049 | A1 * | 3/2009 | Son et al. ..................... 136/256 |
| 2010/0225231 | A1 * | 9/2010 | Cok .............................. 313/512 |

FOREIGN PATENT DOCUMENTS

| JP | 2000277254 A | 10/2000 |
| JP | 2002075170 A | 3/2002 |
| JP | 2002158088 A | 5/2002 |
| JP | 2004265776 A | 9/2004 |
| JP | 2005327735 A | 11/2005 |
| JP | 2007035322 A | 2/2007 |
| JP | 2007141474 A | 6/2007 |
| JP | 2009142719 A | 7/2009 |
| JP | 2009238481 A | 10/2009 |
| JP | 2009259656 A | 11/2009 |
| KR | 1020050098331 A | 10/2005 |
| KR | 1020060070166 A | 6/2006 |

(Continued)

*Primary Examiner* — Lex Malsawma
(74) *Attorney, Agent, or Firm* — Robert E. Bushnell, Esq.

(57) ABSTRACT

A getter composition including a moisture absorbing material and a binder having a volatility of 400 ppm or less when heated to a temperature in the range of 60° C. to 120° C. for 2 hours and an organic light emitting diode device including the getter composition.

18 Claims, 8 Drawing Sheets

(56) References Cited

FOREIGN PATENT DOCUMENTS

| KR | 100069751 | B1 | 1/2007 |
| KR | 100670328 | B1 | 1/2007 |
| KR | 100722464 | B1 | 5/2007 |
| KR | 1020070072400 | A | 7/2007 |
| KR | 1020090026928 | A | 3/2009 |

* cited by examiner

GETTER COMPOSITION AND ORGANIC LIGHT EMITTING DIODE DEVICE INCLUDING THE SAME

CLAIM OF PRIORITY

This application makes reference to, incorporates the same herein, and claims all benefits accruing under 35 U.S.C. §119 from an application earlier filed in the Korean Intellectual Property Office on 8 Dec. 2009 and there duly assigned Serial No. 10-2009-0121360.

BACKGROUND OF THE INVENTION

1. Field of the Invention

This disclosure relates to a getter composition and an organic light emitting diode device including the getter composition.

2. Description of the Related Art

An organic light emitting diode device includes two electrodes and an emission layer interposed therebetween. Electrons are injected from one of the electrodes and are combined in the emission layer with holes injected from the other of the electrodes to generate excitons which release energy by emitting light.

SUMMARY OF THE INVENTION

One aspect of this disclosure provides a getter composition improving life-span of an organic light emitting diode device by preventing display defects from forming.

Another aspect of this disclosure provides an organic light emitting diode device that includes the getter composition According to one aspect of the present invention, there is provided a getter composition that includes a moisture absorbing material and a binder, wherein the binder has a volatility that results in an impurity concentration in the organic emission layer of about 400 ppm or less (i.e., volatility of 400 ppm or less) when heated to a temperature in the range of 60° C. to 120° C. for 2 hours. The binder may include one of a silicone resin, an epoxy resin or a combination thereof. The binder may include a silicone resin, and the binder may have a weight loss rate of 0.6 wt % or less when cured at a temperature in the range of 80° C. to 120° C. The binder may include silicone resin, and the binder may have a weight loss rate of 0.6 wt % or less when cured at a temperature in the range of 80° C. to 120° C. The getter composition may be absent of a solvent. The moisture absorbing material may have a particle size in the range of 10 nm to 500 nm. The moisture absorbing material may have an average particle size in the range of 150 nm to 250 nm. The moisture absorbing material may include at least one of aluminum (Al), magnesium (Mg), manganese (Mn), iron (Fe), calcium (Ca), barium (Ba), strontium (Sr) and oxides thereof. The moisture absorbing material and the binder can include in an amount of 20 wt % to 80 wt % respectively based on the entire amount of the getter composition. The getter composition may be a liquid.

According to another aspect of the present invention, there is provided an organic light emitting diode device that includes a first substrate and a second substrate, an organic emission layer arranged between the first substrate and the second substrate and a getter arranged between the first substrate and the second substrate, wherein the getter comprises a moisture absorbing material and a binder having a volatility that results in an impurity concentration in the organic emission layer of about 400 ppm or less when heated to a temperature in the range of 60° C. to 120° C. for 2 hours.

The binder may include silicone resin, epoxy resin or a combination thereof. The binder may include a silicone resin and have a weight loss of 0.6 wt % or less at a temperature in the range of 80° C. to 120° C. The binder can include an epoxy resin and have a weight loss of 1 wt % or less at a temperature in the range of 80° C. to 120° C. The binder may be absent of a solvent. The moisture absorbing material may have a particle size in the range of 10 nm to 500 nm. The moisture absorbing material may have an average particle size in the range of 150 nm to 250 nm. The moisture absorbing material may include at least one of aluminum (Al), magnesium (Mg), manganese (Mn), iron (Fe), calcium (Ca), barium (Ba), strontium (Sr) and oxides thereof.

The organic light emitting diode device may further include a sealing member arranged between the first substrate and the second substrate to attach and fix the first substrate to the second substrate, the getter may be arranged between the organic emission layer and the sealing member. The getter may be further arranged at a location that overlaps the organic emission layer. The getter may be surrounded by the sealing member.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

This disclosure will be more fully described hereinafter with reference to the accompanying drawings, in which exemplary embodiments of this disclosure are shown. As those skilled in the art would realize, the described embodiments may be modified in various different ways, all without departing from the spirit or scope of this disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
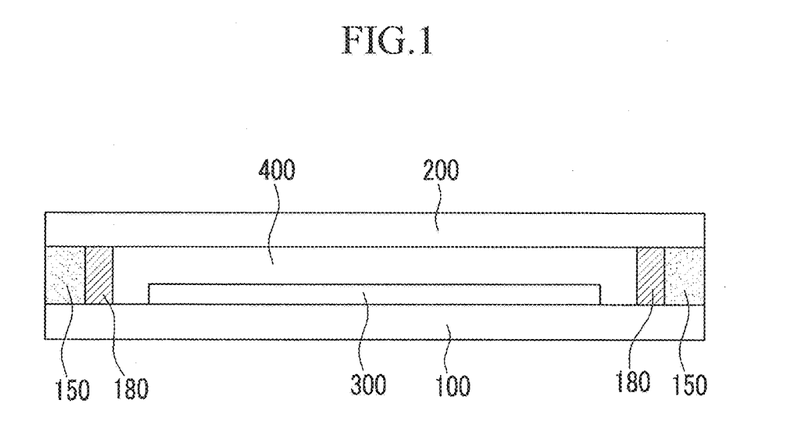
FIG. 1 is a cross-sectional view of an organic light emitting diode device according to a first embodiment of the present invention.

Referring to FIG. 1, FIG. 1 is a cross-sectional view of an organic light emitting diode device according to the first embodiment of the present invention. The organic light emitting diode device according to the first embodiment includes an organic light emitting element 300, a base substrate 100 supporting the organic light emitting element 300, an encapsulation substrate 200 covering the organic light emitting element 300, a sealing member 150 attaching the base substrate 100 to the encapsulation substrate 200 and fixing them together, a filler 400 filled within a region defined by the sealing member 150, and a getter 180 arranged between the sealing member 150 and the filler 400.

The organic light emitting element 300 may include a pair of electrodes and an organic emission layer arranged between the pair of electrodes. One of the electrodes may be an anode while the other may be a cathode. The anode is an electrode that injects holes into the organic emission layer and may be made out of a transparent conductive material having a high work function, such as ITO (indium tin oxide) or IZO (indium zinc oxide). The cathode is an electrode that injects electrons into the organic emission layer and may be made out of a conducting material having no influence on an organic material and may have a low work function, such as aluminum (Al), calcium (Ca), or barium (Ba).

The organic emission layer may include an organic light emitting material that is capable of emitting color when a voltage is applied to the pair of electrodes. The organic light emitting material may include an organic material, an inorganic material, or combination thereof that inherently emits light such as three primary colors of red, green, and blue. For example, it may include aluminum tris(8-hydroxyquinoline) [Alq3], anthracene, a distryl compound or a combination thereof. The organic light emitting diode device displays a desirable image by spatial-summing primary color light emitted from the emission layer.

An auxiliary layer (not shown) may be interposed between one electrode and an organic emission layer and between the other electrode and the organic emission layer. The auxiliary layer may include a hole transport layer (HTL), a hole injection layer (HIL), an electron injection layer (EIL), and an electron transport layer (ETL) for balancing electrons and holes.

The base substrate 100 is arranged under and supports the organic light emitting element 300. The base substrate 100 may be a silicon wafer or may be made out of glass, polymer or the like.

The encapsulation substrate 200 covers the organic light emitting element 300 and may prevent the inflow of moisture and oxygen from the outside. The encapsulation substrate 200 may be made out of glass, polymer, metal, or the like.

The filler 400 may be an inorganic filler, organic filler or a combination thereof.

The sealing member 150 may have a band shape and be arranged along the edge of the base substrate 100 and the encapsulation substrate 200, but the present invention is not limited thereto. The sealing member 150 attaches the base substrate 100 to the encapsulation substrate 200 and fixes them together.

The getter 180 may be a getter composition in liquid form. The getter composition may include a moisture absorbing material and a binder. The moisture absorbing material may absorb moisture and may include at least one of aluminum (Al), magnesium (Mg), manganese (Mn), iron (Fe), calcium (Ca), barium (Ba), strontium (Sr), and oxides thereof.

The moisture absorbing material may have a particle size ranging from about 10 nm to about 500 nm. When the moisture absorbing material has a particle size within this range, the moisture absorbing material may have a larger specific surface area and effectively absorb moisture.

In addition, the moisture absorbing material may have an average particle size ranging from about 150 nm to about 250 nm. When the moisture absorbing material has an average particle size within this range, it may have more uniform sizes, improving distribution property and securing uniformity of life-span of devices throughout a device area.

The binder may include a silicone resin, an epoxy resin, or a combination thereof. Since the silicone resin and the epoxy resin are liquid, the getter composition does not include a solvent. In the present invention, the binder has a low volatility so that the impurity concentration in the organic emission layer caused by the binder can be limited. If the volatility of the binder were to be high, the vapor pressure of the binder would also be high, resulting in a high impurity concentration in the organic emission layer. Such a high impurity concentration in the organic emission layer can produce stains or dark spots in the organic emission layer. In the present invention, by limiting the volatility of the binder, the impurity concentration in the organic emission layer can be limited, resulting in no staining or damage to the organic emission layer.

The term "volatility" is defined as the tendency of a solid or liquid material to pass into a vapor state at a given temperature. Strictly speaking, "volatility" is a vapor pressure of a component divided by its mole fraction in the liquid or solid. Since the mole fraction is often close to unity, the volatility is essentially directly related to the vapor pressure of the substance. Vapor pressure for a given substance varies with temperature. The higher the temperature, the higher the volatility. In the present invention, the volatility of the binder is minimized so that the vapor pressure of the binder, upon application of heat, is also limited. This results in a limited impurity concentration being formed in the organic emission layer due to the volatility of the binder.

In the present invention, the binder may have a sufficiently low volatility so that the impurity concentration in the organic emission layer caused by the binder is limited to 400 ppm or less when heated to a temperature ranging from about 60° C. to about 120° C. for about 2 hours. The binder may have a volatility that produces an impurity concentration in the organic emission layer ranging from about 10 ppm to about 400 ppm. When the binder has a low volatility, it may produce only a small amount of out-gassing during the heating process and/or heating operation, resulting in a smaller amount of binder material that can permeate into the organic emission layer. Accordingly, after the heating process and/or long-term heating operation, the low volatility of the binder may prevent the binder from producing a display defect such as a stain or a dark spot in a display area.

When the binder includes a silicone resin that has volatility, it may have a weight loss of about 0.6 wt % or less at a temperature ranging from about 80° C. to about 120° C. Otherwise, when the binder includes an epoxy resin and that has volatility, it may have a weight loss of about 1 wt % or less when cured at a temperature ranging from about 80° C. to about 120° C.

The moisture absorbing material and the binder may be respectively included in an amount of about 20 wt % to about 80 wt % based on the entire amount of the getter composition. When they are included within the range, the moisture absorbing material and the binder may be included in an amount ranging from about 30 wt % to about 50 wt % and about 50 wt % to about 70 wt % respectively based on the entire amount of the getter composition.

Figure 2:
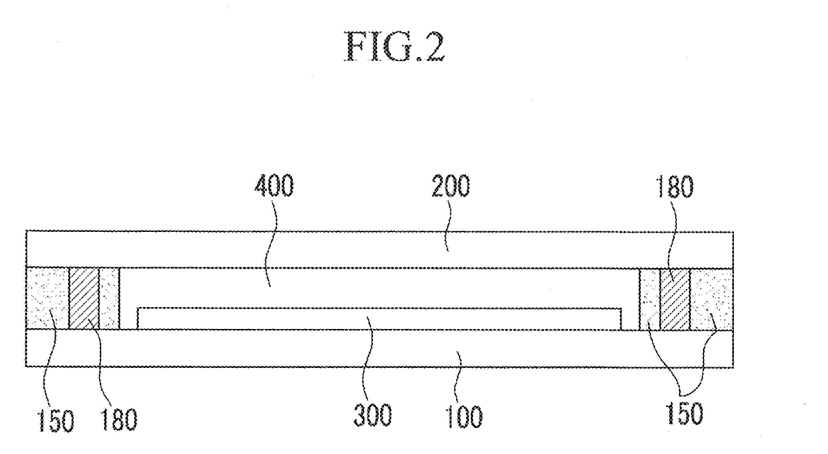
FIG. 2 is a cross-sectional view of an organic light emitting diode device according to a second embodiment of the present invention.

Hereinafter, an organic light emitting diode device according to a second embodiment is illustrated referring to FIG. 2. FIG. 2 is a cross-sectional view of the organic light emitting diode device according to the second embodiment. Referring to FIG. 2, the organic light emitting diode device includes an organic light emitting element 300, a base substrate 100 supporting the organic light emitting element 300, an encapsulation substrate 200 covering the organic light emitting element 300, a sealing member 150 attaching the base substrate 100 to the encapsulation substrate 200 and fixing them together, and a filler 400 filled within a region defined by the sealing member 150 as in the first embodiment.

However, the organic light emitting diode device according to the second embodiment may include a getter 180 surrounded on both sides by sealing member 150. The getter 180 absorbs moisture permeated through the sealing member 150 and thus may protect the organic light emitting element 300 from external moisture.

Figure 3:
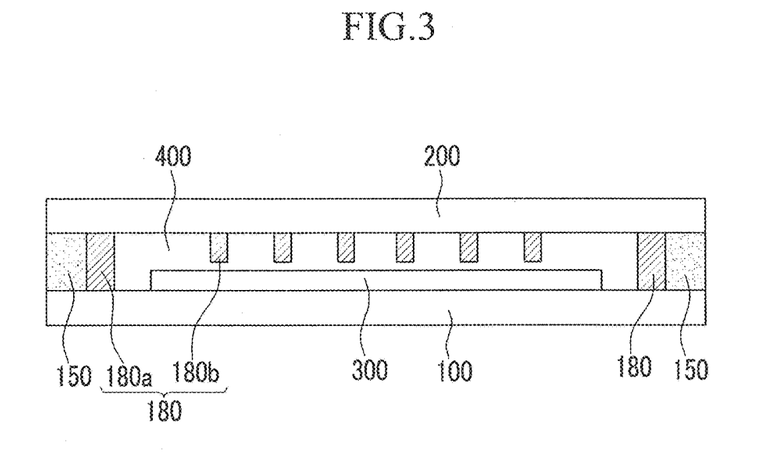
FIG. 3 is a cross-sectional view of an organic light emitting diode device according to a third embodiment of the present invention.

Another organic light emitting diode device according to a third another embodiment is illustrated referring to FIG. 3. FIG. 3 is a cross-sectional view showing an organic light emitting diode device according to the third embodiment. Referring to FIG. 3, the organic light emitting diode device, like the previous embodiments, may include an organic light emitting element 300, a base substrate 100 supporting the organic light emitting element 300, an encapsulation substrate 200 covering the organic light emitting element 300, a sealing member 150 attaching the base substrate 100 to the encapsulation substrate 200 and fixing them together, and a filler 400 filled within the region defined by the sealing member 150.

However, unlike the first and second embodiments, the organic light emitting diode device according to the third embodiment may further include a getter 180b formed in a display area and overlapping the organic light emitting element 300 as well as a getter 180a arranged between the sealing member 150 and the filler 400. The getter 180 may be arranged on the encapsulation substrate 200 and then the base substrate 100 and the encapsulation substrate 200 may be assembled.

The following examples illustrate this disclosure in more detail. These examples, however, are not in any sense to be interpreted as limiting the scope of this disclosure.

Preparation of a Getter Composition

Example 1

A getter composition was prepared by mixing 30 wt % of calcium oxide having an average particle size of 100 nm with 70 wt % of silicone resin.

Example 2

A getter composition was prepared by mixing 30 wt % of calcium oxide having an average particle size of 100 nm with 70 wt % of epoxy resin.

Example 3

A getter composition was prepared by mixing 30 wt % of calcium oxide having an average particle size of 500 nm with 70 wt % of silicone resin.

Comparative Example 1

A getter composition was prepared by including an epoxy resin, without calcium oxide.

Comparative Example 2

A getter composition was prepared by using 30 wt % of calcium oxide having an average particle size of 100 nm, 60 wt % of epoxy resin and 10 wt % of ethanol.

Measurement of Moisture Absorption Degrees

The getter compositions according to Example 1 and Comparative Example 1 were measured regarding moisture absorption degrees.

First of all, the getter composition according to Example 1 and Comparative Example 1 were coated on each glass substrate and then, assembled with glass substrates, respectively. Next, the resulting product was thermally cured at a temperature of 80° C.

Figure 4:
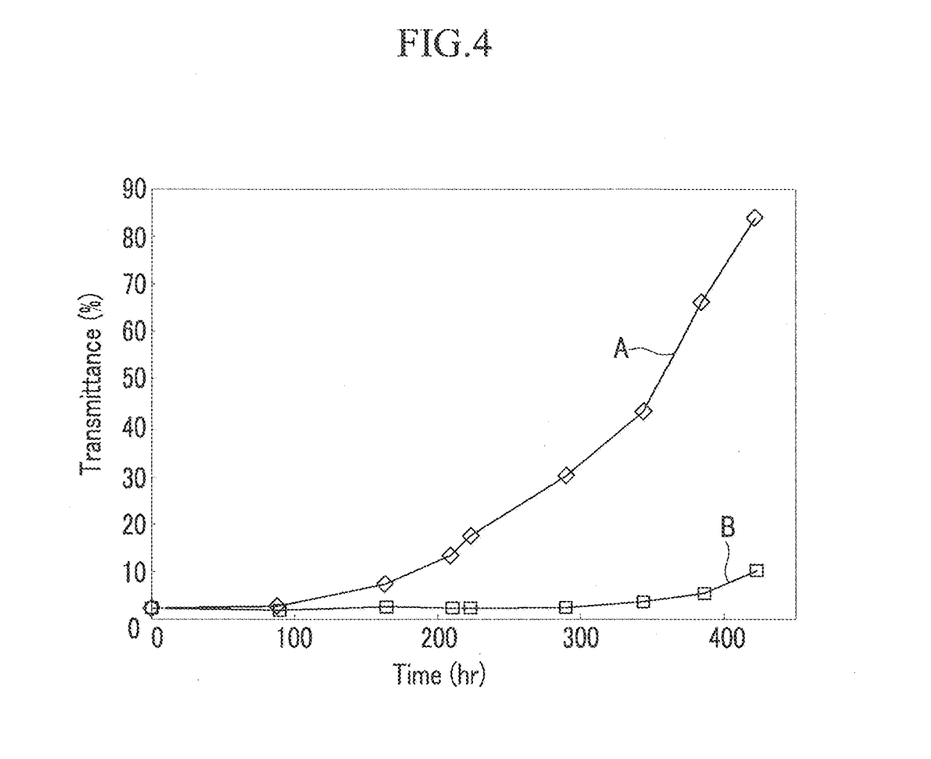
FIG. 4 is a graph showing moisture absorption of a getter composition according to Example 1 and Comparative Example 1.

Using a characteristic that a getter composition becomes transparent when the getter composition absorbs moisture, they were measured regarding transmittance under a condition of a high temperature and high humidity. FIG. 4 is referred to illustrate the results in detail.

FIG. 4 is a graph showing moisture absorption degrees of getter compositions according to Example 1 and Comparative Example 1. Referring to FIG. 4, the getter composition A according to Example 1 had increasing transmittance as time proceeds while the getter composition B according to Comparative Example 1 had almost no transmittance even after much aging. Accordingly, the getter composition A of Example 1 had a tendency of being transparent by absorbing more moisture throughout time, while the getter composition B of Comparative Example 1 had no moisture absorption.

Fabrication of an Organic Light Emitting Diode Device

Application Example 1

ITO was sputtered on a glass substrate and then patterned. Next, Alq3 was deposited thereon to form an electron transport layer. Then, Alq3 (tris 8-hydroxyquinoline aluminum) doped 1 wt % of cumarin 6 was arranged thereon by co-depositing as an emission layer. Next, NPB (N,N-dinaphthalene-1-yl-N,N-diphenyl-benzidine) was arranged thereon as a hole injection layer (HIL) and a hole transport layer. Then, Al was sequentially deposited thereon. Next, a sealing member was applied along the edge of a glass substrate using a dispenser. Then, the getter composition of Example 1 was applied between the organic light emitting element and the sealing member. The sealing member was cured using a solid laser after another glass substrate with the same size as the glass substrate was attached together on the above product.

Application Example 2

An organic light emitting diode device was fabricated according to the same method as Application Example 1 except for using the getter composition according to Example 2.

Application Comparative Example 1

An organic light emitting diode device was fabricated according to the same method as Application Example 1 except for including no getter composition.

Application Comparative Example 2

An organic light emitting diode device was fabricated according to the same method as Application Example 1 except for using the getter composition according to Comparative Example 2.

Display Characteristic Evaluation-1

Figure 5A:
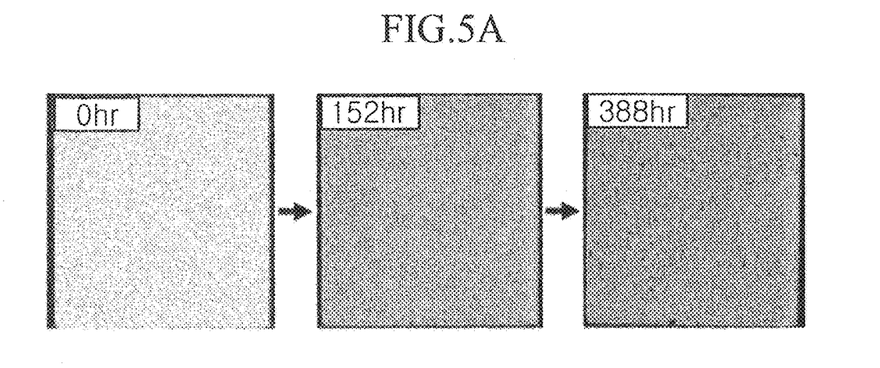
FIG. 5A is a time progression series of photographs showing display degradation of an organic light emitting diode device according to Application Example 1 upon being exposed to a hot and humid atmosphere.
Figure 5B:
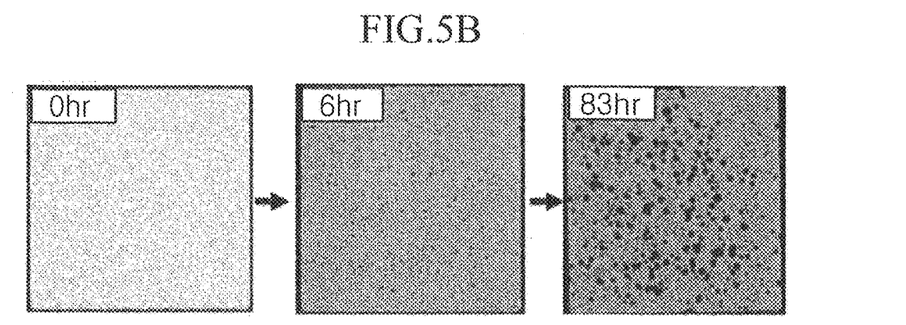
FIG. 5B is a time progression series of photographs showing display degradation of an organic light emitting diode device according to Application Comparative Example 1 upon being exposed to a hot and humid atmosphere.

The organic light emitting diode devices according to Application Example 1 and Application Comparative Example 1 were allowed to stand at 85° C. of temperature and 85% of humidity and checked whether the display developed stains as time proceeded. Referring to FIGS. 5A and 5B, the results are illustrated.

FIG. 5A is a photograph showing display degradation of the organic light emitting diode device according to Application Example 1 as time proceeded and FIG. 5B is a photograph showing display degradation of the organic light emitting diode device according to Application Comparative Example 1 as time proceeded.

Referring to FIG. 5A, the organic light emitting diode device according to Application Example 1 did not develop appreciable display stains after 152 hours and only a small amount of display stains after 388 hours. On the contrary, FIG. 5B shows that the organic light emitting diode device of Application Comparative Example 1 after 6 hours turned out to have a similar amount of stains as Application Example 1 did after 388 hours. After 83 hours, Application Comparative Example 1 had much more stains than Application Example 1 did after 388 hours.

The stains develop as an organic emission layer deteriorates due to moisture when a getter is not arranged within the device. Accordingly, since the organic light emitting diode device according to Application Example 1 includes getter and thus absorbs moisture, the organic light emitting diode device may be prevented from degrading and have improved display lifespan.

Display Characteristic Evaluation-2

Figure 6A:
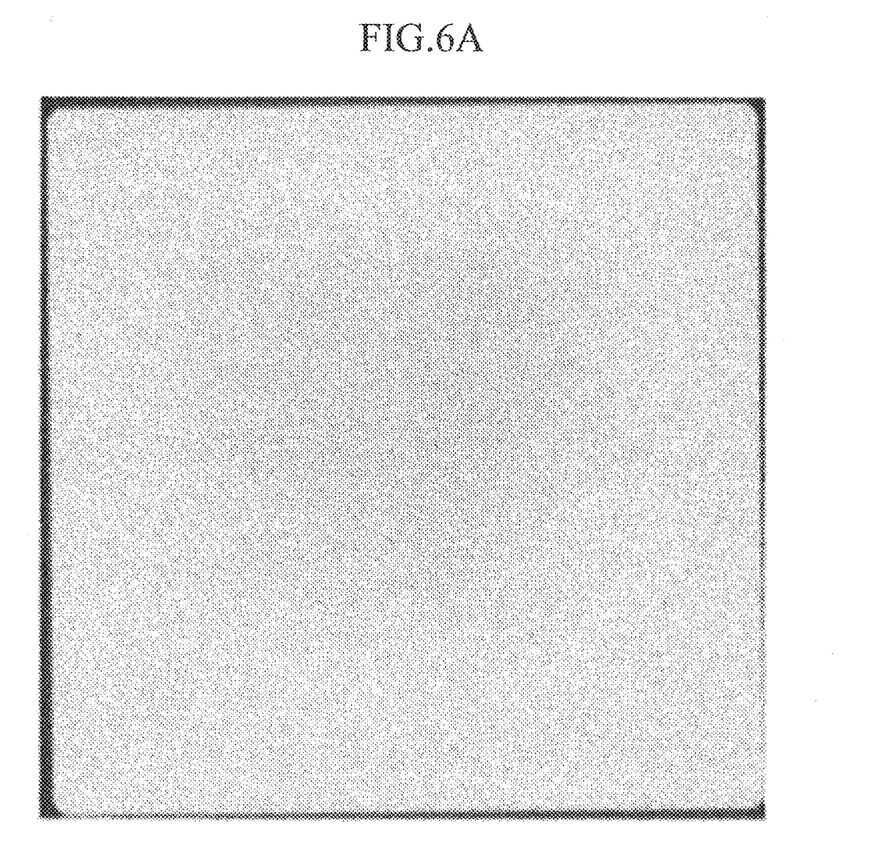
FIG. 6A is a photograph showing display degradation of an organic light emitting diode device according to Application Example 2 after being aged in a hot and humid atmosphere for a period of time.
Figure 6B:
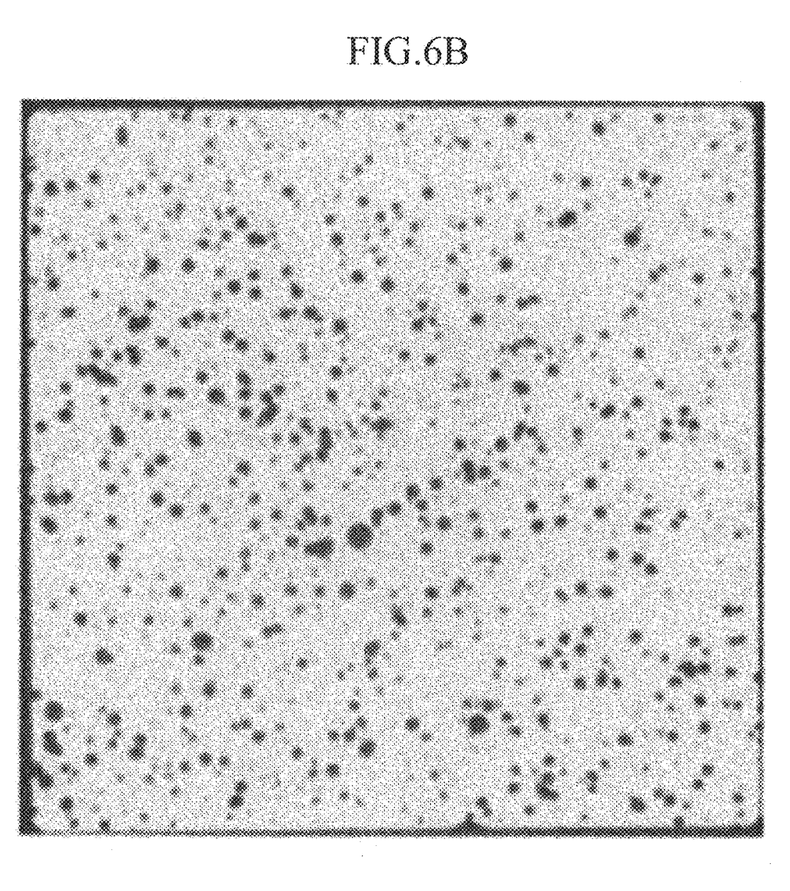
FIG. 6B is a photograph showing display degradation of an organic light emitting diode device according to Application Comparative Example 2 after being aged in a hot and humid atmosphere for a period of time.

The organic light emitting diode devices according to Application Example 2 and Application Comparative Example 2 were allowed to stand under 85° C. of temperature and 85% of humidity for 100 hours and checked to see whether display stains had developed or not. FIGS. 6A and 6B show the results in detail.

FIG. 6A is a photograph showing display degratation of the organic light emitting diode device according to Example 2 as after 100 hours at 85° C. of temperature and 85% of humidity and FIG. 6B is a photograph showing display degradation of the organic light emitting diode device according to Application Comparative Example 2 after 100 hours at 85° C. of temperature and 85% of humidity.

Referring to FIG. 6A, the organic light emitting diode device according to Application Example 2 had a very small amount of stains after 100 hours while FIG. 6B showed that the display according to Application Comparative Example 2 had a lot of stains after 100 hours.

An explanation for these results is that a volatile component in a binder included in a getter composition according to the present invention infiltrates into an organic emission layer and forms impurities. Accordingly, when used as a getter composition according to an exemplary embodiment, it may decrease the amount of stains by controlling the volatility of the binder. Therefore, the organic light emitting diode device may have less display degradation and increased life-span.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A getter composition, comprising;
a moisture absorbing material; and
a binder,
wherein the binder has a volatility of about 400 ppm or less when heated to a temperature in the range of 60° C. to 120° C. for 2 hours, and
the moisture absorbing material comprises at least one material selected from the group consisting of manganese (Mn), and manganese oxide thereof.

2. The getter composition of claim 1, wherein the binder comprises a material selected from a group consisting of silicone resin, epoxy resin and a combination thereof.

3. The getter composition of claim 2, wherein the binder comprises silicone resin, and the binder has a weight loss rate of 0.6 wt % or less when cured at a temperature in the range of 80° C. to 120° C.

4. The getter composition of claim 2, wherein the binder comprises epoxy resin, and wherein the binder has a weight loss rate of 1 wt % or less when cured at a temperature in the range of 80 to 120° C.

5. The getter composition of claim 2, wherein the getter composition is absent of a solvent.

6. The getter composition of claim 1, wherein the moisture absorbing material has a particle size in the range of 10 nm to 500 nm.

7. The getter composition of claim 6, wherein the moisture absorbing material has an average particle size in the range of 150 nm to 250 nm.

8. The getter composition of claim 1, wherein the moisture absorbing material and the binder comprise in an amount of 20 wt % to 80 wt % respectively based on the entire amount of the getter composition.

9. The getter composition of claim 1, wherein the getter composition is a liquid.

10. An organic light emitting diode device, comprising:
a first substrate and a second substrate;
an organic emission layer arranged between the first substrate and the second substrate; and
a getter arranged between the first substrate and the second substrate, wherein:
the getter comprises a moisture absorbing material and a binder having a volatility of about 400 ppm or less when heated to a temperature in the range of 60° C. to 120° C. for 2 hours;
the moisture absorbing material comprises at least one material selected from the group consisting of manganese (Mn), iron (Fe), and oxides thereof; and
the getter is further arranged at a location that overlaps the organic emission layer.

11. The organic light emitting diode device of claim 10, wherein the binder comprises a silicone resin and has a weight loss of 0.6 wt % or less at a temperature in the range of 80° C. to 120° C.

12. The organic light emitting diode device of claim 11, wherein the moisture absorbing material has a particle size in the range of 10 nm to 500 nm.

13. The organic light emitting diode device of claim 12, wherein the moisture absorbing material has an average particle size in the range of 150 nm to 250 nm.

14. The organic light emitting diode device of claim 12, further comprising a sealing member arranged between the first substrate and the second substrate to attach and fix the first substrate to the second substrate, the getter being arranged between the organic emission layer and the sealing member.

15. The organic light emitting diode device of claim 13, further comprising a sealing member arranged between the first substrate and the second substrate to attach and fix the first substrate to the second substrate, the getter being surrounded by the sealing member.

16. The organic light emitting diode device of claim 10, wherein the binder comprises a material selected from a group consisting of silicone resin, epoxy resin and a combination thereof.

17. The organic light emitting diode device of claim 16, wherein the binder comprises an epoxy resin and has a weight loss of 1 wt % or less at a temperature in the range of 80° C. to 120° C.

18. The organic light emitting diode device of claim 17, wherein the binder is absent of a solvent.

* * * * *